(12) United States Patent
Kim

(10) Patent No.: US 11,330,214 B2
(45) Date of Patent: May 10, 2022

(54) COMPARATOR AND IMAGE SENSING DEVICE INCLUDING THE SAME

(71) Applicant: SK hynix Inc., Icheon-si (KR)

(72) Inventor: Hyeon-June Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 112 days.

(21) Appl. No.: 16/716,110

(22) Filed: Dec. 16, 2019

(65) Prior Publication Data

US 2020/0280693 A1  Sep. 3, 2020

(30) Foreign Application Priority Data

Feb. 28, 2019  (KR) .................. 10-2019-0024006

(51) Int. Cl.
| | |
|---|---|
| *H04N 5/3745* | (2011.01) |
| *H01L 27/146* | (2006.01) |
| *H04N 5/378* | (2011.01) |
| *H04N 5/374* | (2011.01) |
| *H04N 5/361* | (2011.01) |
| *H04N 5/357* | (2011.01) |
| *H04N 5/369* | (2011.01) |

(52) U.S. Cl.
CPC ... *H04N 5/37455* (2013.01); *H01L 27/14643* (2013.01); *H04N 5/378* (2013.01)

(58) Field of Classification Search
CPC .... H04N 5/37455; H04N 5/378; H04N 5/374; H04N 5/361; H01L 27/14643; H01L 27/146; H01L 27/14601
See application file for complete search history.

(56) References Cited

U.S. PATENT DOCUMENTS

| | | | |
|---|---|---|---|
| 9,967,505 B1* | 5/2018 | Ebihara | .................. H04N 5/378 |
| 2004/0036643 A1 | 2/2004 | Bock | |
| 2010/0231772 A1* | 9/2010 | Lebouleux | ............. H04N 5/374 |
| | | | 348/308 |
| 2017/0272678 A1* | 9/2017 | Sakakibara | ........ H04N 5/37455 |
| 2018/0288345 A1* | 10/2018 | Nakahara | ............... H04N 5/357 |
| 2019/0035834 A1 | 1/2019 | Kim et al. | |

FOREIGN PATENT DOCUMENTS

| | | |
|---|---|---|
| CN | 102438109 A | 5/2012 |
| CN | 103684460 A | 3/2014 |
| CN | 104617930 A | 5/2015 |
| CN | 105519096 A | 4/2016 |
| CN | 107872634 A | 4/2018 |
| KR | 101507199 | 3/2015 |
| KR | 101569953 | 11/2015 |

OTHER PUBLICATIONS

Office Action dated Jan. 24, 2022 in Chinese Patent Application No. 201911198465.1 with English translation, 24 pages.

* cited by examiner

*Primary Examiner* — Albert H Cutler
(74) *Attorney, Agent, or Firm* — Perkins Coie LLP

(57) ABSTRACT

A comparator is provided to comprise a comparison circuit including a first transistor configured to receive a ramp signal and a second transistor configured to receive a pixel signal, the comparison circuit configured to compare the ramp signal and the pixel signal and output a comparison signal at an output node, and an output swing control circuit including a third transistor coupled to the first transistor and the second transistor, and the output swing control circuit including a current path to decrease an amount of current flowing through the second transistor.

18 Claims, 7 Drawing Sheets

COMPARATOR AND IMAGE SENSING DEVICE INCLUDING THE SAME

CROSS-REFERENCE TO RELATED APPLICATION

This patent document claims priority under 35 U.S.C. § 119 to Korean Patent Application No. 10-2019-0024006 filed on Feb. 28, 2019, which is incorporated herein by reference in its entirety.

TECHNICAL FIELD

Exemplary embodiments relate to a complementary metal oxide semiconductor (CMOS) image sensor (CIS) including a comparator.

BACKGROUND

A CIS performs an operation of converting an analog signal (pixel signal) outputted from a pixel array into a digital signal. In order to convert an analog signal into a digital signal, the CIS uses a high-resolution analog-to-digital converter (ADC) therein. The CIS may employ a single ADC scheme using a single ADC or a column ADC scheme using column ADCs.

SUMMARY

Various embodiments of the disclosed technology are directed to a comparator and an image sensing device including the comparator. In some implementations, an output voltage of the comparator is controlled to improve a resolution of an image.

In one aspect, a comparator is provided to comprise: a comparison circuit including a first transistor configured to receive a ramp signal and a second transistor configured to receive a pixel signal, the comparison circuit configured to compare the ramp signal and the pixel signal and output a comparison signal at an output node; and an output swing control circuit coupled to the first transistor and the second transistor, and the output swing control circuit including a current path to decrease an amount of current flowing through the second transistor.

In another aspect, an image sensing device is provided to comprise: a pixel array including photoelectric conversion elements, each photoelectric conversion element configured to produce a pixel signal in response to light incident on the pixel array; a ramp signal generator to generate a ramp signal; a comparison circuit coupled to the pixel array and the ramp signal generator to receive the pixel signal and the ramp signal, the comparison circuit configured to compare the ramp signal and the pixel signal; and an output swing control circuit coupled to the comparison circuit and configured to maintain an output voltage of the comparison circuit to be equal to or greater than a preset voltage.

In another aspect, a comparator is provided to include a first mirror circuit coupled between a supply voltage and a second mirror circuit; the second mirror circuit configured to receive a ramp signal and a pixel signal, compare the ramp signal and the pixel signal, and output a comparison signal at an output node; and a sink circuit coupled to the second mirror circuit for adjusting an amount of current based on a common voltage to secure an operation margin of the second mirror circuit.

DETAILED DESCRIPTION

This patent document provides implementations and examples of a comparator and an image sensing device including the comparator, which can be useful in various electronic applications. Various implementations of the disclosed technology provide a comparator to perform A/D conversion, which is designed to maintain an operation region (e.g., a saturation region) of an input transistor without any change to another region (e.g., a triode region or a linear region).

Image sensing devices are applied to various applications in a wide variety of fields, including machine vision, robotics, guidance and navigation, automotive applications, and consumer products. The image sensing device includes an image sensing region (e.g., pixel array) which includes one or more photo-electric conversion elements configured to generate photocharges in response to light incident on the image sensing region. The image sensing region may be arranged as arrays of elements including rows and columns, which can be read out, for example, a column at a time. As it is read out, each column is driven and the analog signals that are read out from the pixel array 10 are converted to digital signals to facilitate subsequent processing of the image.

The image sensing device can perform the analog-to-digital conversion (ADC) in various manners. One example of the ADC is a single ADC scheme employing one ADC which operates at high speed. The single ADC converts analog signals outputted from all columns of the pixel array into digital signals within a predetermined time. The single ADC scheme can reduce the chip area of the CIS but has high power consumption because the ADC needs to operate at high speed.

Another example of the ADC is a column ADC scheme employing multiple ADCs (e.g., single-slope ADCs) coupled to the respective columns of the pixel array. The column ADC scheme occupies a greater area as compared to the single ADC scheme but has small power consumption because each of the ADCs does not need to operate at the high speed as in the single ADC scheme.

The CIS with the column ADC structure includes correlated double sampling (CDS) blocks. The pixel array in the CIS converts the light to the electrical signal, e.g., an analog output voltage, and the CDS blocks performs sampling on the analog output voltage. The CIS is further configured to store the sampled voltage, compare the voltage stored during the CDS operation with a predetermined ramp signal generated by a ramp signal generator, and provide a comparison signal to be used to generate a digital code corresponding to the analog output voltage from the pixel array.

Figure 1:
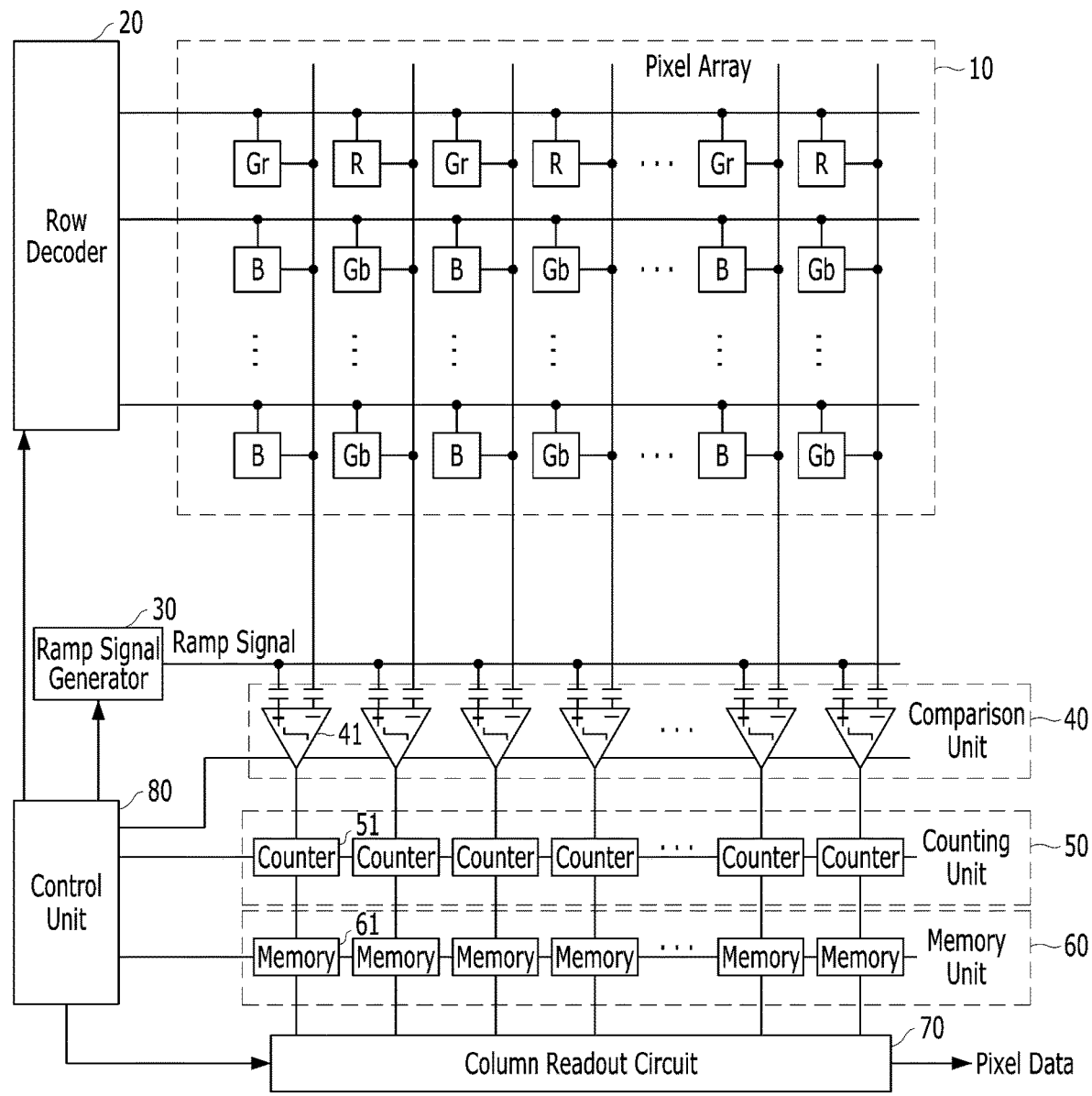
FIG. 1 is a diagram illustrating an example of a CIS for promoting understanding of embodiments.

As an example, a column parallel CIS with a single-slope ADC will be discussed with reference to FIG. 1. FIG. 1 illustrates an example of a CIS.

As illustrated in FIG. 1, the CIS for promoting understandings of the embodiments may include a pixel array 10, a row decoder 20, a ramp signal generator 30, a comparison unit 40, a counting unit 50, a memory unit 60, a control unit 80 and a column readout circuit 70. The pixel array 10 may output pixel signals corresponding to incident light. The row decoder 20 may select a pixel in the pixel array 10 at each row line and control an operation of the selected pixel, under control of the control unit 80 (for example, a timing generator). The single-slope ADC may use an operational transconductance amplifier (OPA) using five or more transistors or an inverter-type comparator using two or more transistors. In some cases, the single-slope ADC may use up to three comparators from a first stage to a third stage.

The comparison unit 40 may include a plurality of comparators, the counting unit 50 may include a plurality of counters, and the memory unit 60 may include a plurality of memories. Thus, the comparators, the counters and the memories may be provided at the respective columns. In order to remove an offset value of each pixel, the comparison unit 40 may compare pixel signals, which are outputted from the pixel array 10, before and after light is incident on the pixel array 10, and measure only a pixel signal generated by the incident light. Such a technique may be referred to as correlated double sampling (CDS). The detailed operations of the CDS will be discussed with reference to FIG. 2.

Figure 2:
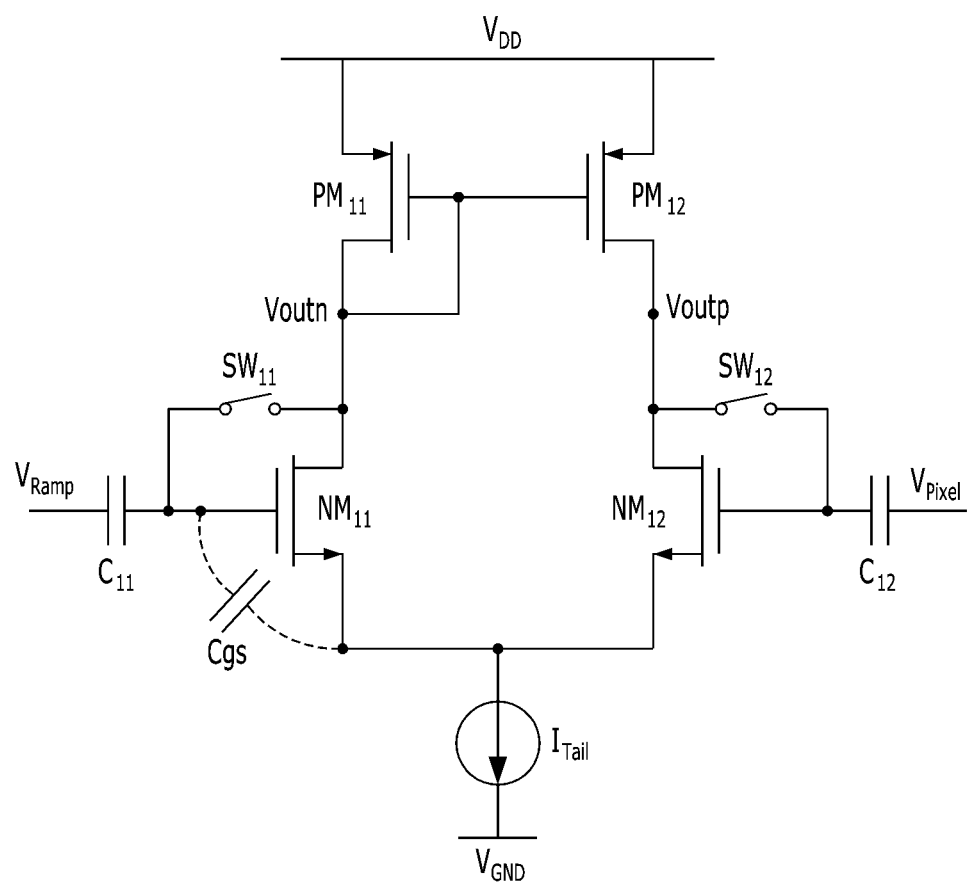
FIG. 2 is a diagram illustrating an example of a comparator of FIG. 1.

FIG. 2 shows an example of a comparator included in a comparison unit of a CIS. As illustrated in FIG. 2, the comparator may include a PMOS transistor $PM_{11}$, a PMOS transistor $PM_{12}$, a capacitor $C_{11}$, a capacitor $C_{12}$, an NMOS transistor $NM_{11}$, an NMOS transistor $NM_{12}$, a switch $SW_{11}$ and a switch $SW_{12}$. The PMOS transistor $PM_{11}$ may have a diode-connection structure in which a source terminal thereof is coupled to a first supply voltage $V_{DD}$ and gate and drain terminals thereof are coupled to each other. The PMOS transistor $PM_{12}$ may have a source terminal coupled to the first supply voltage $V_{DD}$, a gate terminal coupled to the gate terminal of the PMOS transistor $PM_{11}$, and a drain terminal coupled to an output node Voutp. The capacitor $C_{11}$ may have one terminal configured to receive the ramp signal Vramp, i.e., a ramp voltage, and the other terminal coupled to a gate terminal of the NMOS transistor $NM_{11}$. The capacitor $C_{12}$ may have one terminal configured to receive a pixel signal $V_{Pixel}$, i.e. a pixel voltage, and the other terminal coupled to a gate terminal of the NMOS transistor $NM_{12}$. The NMOS transistor $NM_{11}$ may have a drain terminal coupled to the drain terminal of the PMOS transistor $PM_{11}$, the gate terminal coupled to the other terminal of the capacitor $C_{11}$, and a source terminal coupled to a second supply voltage $V_{GND}$ through a current source $I_{Tail}$. The NMOS transistor $NM_{12}$ may have a drain terminal coupled to the output node Voutp, the gate terminal coupled to the other terminal of the capacitor $C_{12}$, and a source terminal coupled to the second supply voltage $V_{GND}$ through the current source $I_{Tail}$. The switch $SW_{11}$ may be coupled between the drain terminal and the gate terminal of the NMOS transistor $NM_{11}$. The switch $SW_{12}$ may be coupled between the drain terminal and the gate terminal of the NMOS transistor $NM_{12}$.

The pixel signal $V_{Pixel}$, which is outputted from the pixel array, includes a reset voltage $V_{Reset}$ and the signal voltage $V_{signal}$. In order to perform CDS on the pixel signal $V_{Pixel}$, the switches $SW_{11}$ and $SW_{12}$ may be turned on to sample the reset signal $V_{Reset}$ and the signal voltage $V_{signal}$. By sampling both of the reset and signal levels, it is possible to reduce various forms of noise from the pixel array.

As the switches $SW_{11}$ and $SW_{12}$ are turned on, the voltage levels of the gate terminals and the drain terminals of the NMOS transistor $NM_{11}$ and the NMOS transistor $NM_{12}$ may become equal to each other, and the drain voltages of the PMOS transistor $PM_{11}$ and the PMOS transistor $PM_{12}$ may also become equal to each other.

In the comparator illustrated in FIG. 2, the common voltage of the ramp signal $V_{Ramp}$ may be sampled in the capacitor $C_{11}$ and the reset voltage of the pixel signal $V_{Pixel}$ may be sampled in the capacitor $C_{12}$. Due to the operations and structures of the comparator, an offset signal may exist in the ramp signal $V_{Ramp}$ and the pixel signal $V_{Pixel}$. In this case, the sampling of the ramp signal $V_{Ramp}$ and the pixel signal $V_{Pixel}$ can be performed in consideration of the offset signals.

The common voltage of the ramp signal $V_{Ramp}$ and the reset voltage of the pixel signal $V_{Pixel}$, which are inputted to the comparator, may be held in the gate terminals of the NMOS transistors $NM_{11}$ and $NM_{12}$, and a change of the ramp signal $V_{Ramp}$ or the pixel signal $V_{Pixel}$ may be sensed in the form of AC-coupling through the capacitors $C_{11}$ and $C_{12}$.

The switches $SW_{11}$ and $SW_{12}$ may be turned off in order to sample the signal voltage $V_{signal}$ of the pixel signal $V_{Pixel}$. At this time, switching noise signals caused by switching may be stored in the capacitors $C_{11}$ and $C_{12}$. In an ideal circuit, when the switches $SW_{11}$ and $SW_{12}$ are turned off, signals across the respective switches, which are considered as offset signals, may be offset by each other since the NMOS transistors $NM_{11}$ and $NM_{12}$ have a differential structure. In an actual circuit, however, the switching noise signals are not '0' and affect to reduce the resolution of an image. To address the reduction of the resolution of the mage, a digital double sampling (DDS) operation that offsets the switching noise signals through a difference between a code value after the reset voltage is sampled and a code value after the signal voltage is sampled can be introduced.

When the switches $SW_{11}$ and $SW_{12}$ are turned off and a signal voltage $V_{signal}$ from a pixel is AC-coupled through the capacitor $C_{12}$ and applied to the gate terminal of the NMOS transistor $NM_{12}$ as described above, a voltage level of 'reset voltage $V_{reset}$-signal voltage $V_{signal}$' may be sampled in the gate terminal of the NMOS transistor $NM_{12}$.

The ramp signal $V_{Ramp}$ may be AC-coupled through the capacitor $C_{11}$ and applied to the gate terminal of the NMOS transistor $NM_{11}$. As the voltage level of the ramp signal $V_{Ramp}$ falls or rises, there may exist a certain point where the gate voltage values of the NMOS transistors $NM_{11}$ and $NM_{12}$ may coincide with each other.

When the gate voltage of the NMOS transistor $NM_{11}$ to which the ramp signal is applied crosses the gate voltage of the NMOS transistor $NM_{12}$ to which the CDS value (reset voltage-signal voltage) of the pixel signal is applied, the output voltage value Voutp of the output node may fall or rise by 'voltage difference between NMOS transistors $NM_{11}$ and $N_{12}$×gain'. Thus, an error (e.g., kick-back error) may occur to reduce the resolution of an image. The kick-back error may occur when the magnitude of the change in the output voltage affects a parasitic capacitor which is formed in the gate terminal of the NMOS transistor $NM_{12}$.

In addition, the comparator shown in FIG. 2 causes the banding noise which results in the decrease in the image resolution. Referring back to FIG. 2, in the input transistors $NM_{11}$ and $NM_{12}$ of the comparator, the sizes of a gate-source parasitic capacitor Cgs and a drain-source parasitic capacitor Cds are changed depending on operation regions of the comparator. The ramp signal generator 30 considers several tens to thousands of single-slope ADCs including the comparators as loads, each comparator with the input terminals having parasitic capacitors Cgs and Cds.

The ramp signal generator 30 is driven one step by one step during operation. During the operation, the gate voltage of an input transistor $NM_{11}$ configured to receive a ramp signal $V_{ramp}$ may fall one step by one step. When the falling gate voltage (ramp signal) becomes equal to the gate voltage (pixel signal) of an input transistor $NM_{12}$ configured to receive a pixel signal $V_{Pixel}$, the comparator outputs a comparison signal, a counter 51 performs counting, and a memory 61 stores the counting value. While the comparator 41 outputs the comparison signal, the gate voltage of the input transistor $NM_{11}$ configured to receive the ramp signal $V_{ramp}$ continuously falls since the ramp signal $V_{ramp}$, which falls one step by one step, is inputted until the ramp signal $V_{ramp}$ reaches a preset range.

Thus, the voltage of an output node of the input transistor $NM_{12}$ configured to receive the pixel signal $V_{Pixel}$ continuously falls. Accordingly, the operation region of the input transistor $NM_{12}$ configured to receive the pixel signal is changed from a saturation region to a triode region or linear region. In other words, the voltage of the output node of the input transistor $NM_{12}$ causes the decrease in the drain-source voltage Vds of the input transistor $NM_{12}$. In this case, the input transistor $NM_{12}$ configured to receive the pixel signal $V_{Pixel}$ may operate like a resistor.

For this reason, a common voltage Vcm of the input transistor $NM_{11}$ configured to receive the ramp signal $V_{ramp}$ and the input transistor $NM_{12}$ configured to receive the pixel signal $V_{Pixel}$ is significantly changed. Thus, the parasitic capacitor Cgs between the gate and source of the input transistor $NM_{12}$ configured to receive the ramp signal $V_{ramp}$ is significantly changed.

Since the load of the ramp signal generator 30 is changed depending on the operation regions of the respective comparators 41, the operation regions of each comparators 41 affects the operations of other comparators 41. For example, a non-linear phenomenon, which is referred to as the banding noise, may occur due to the change of the operation regions of the comparator 41. Furthermore, as existing operation points are changed during the operations of the respective comparators 41, the performance of the CDS operation may be affected as well.

Figure 3:
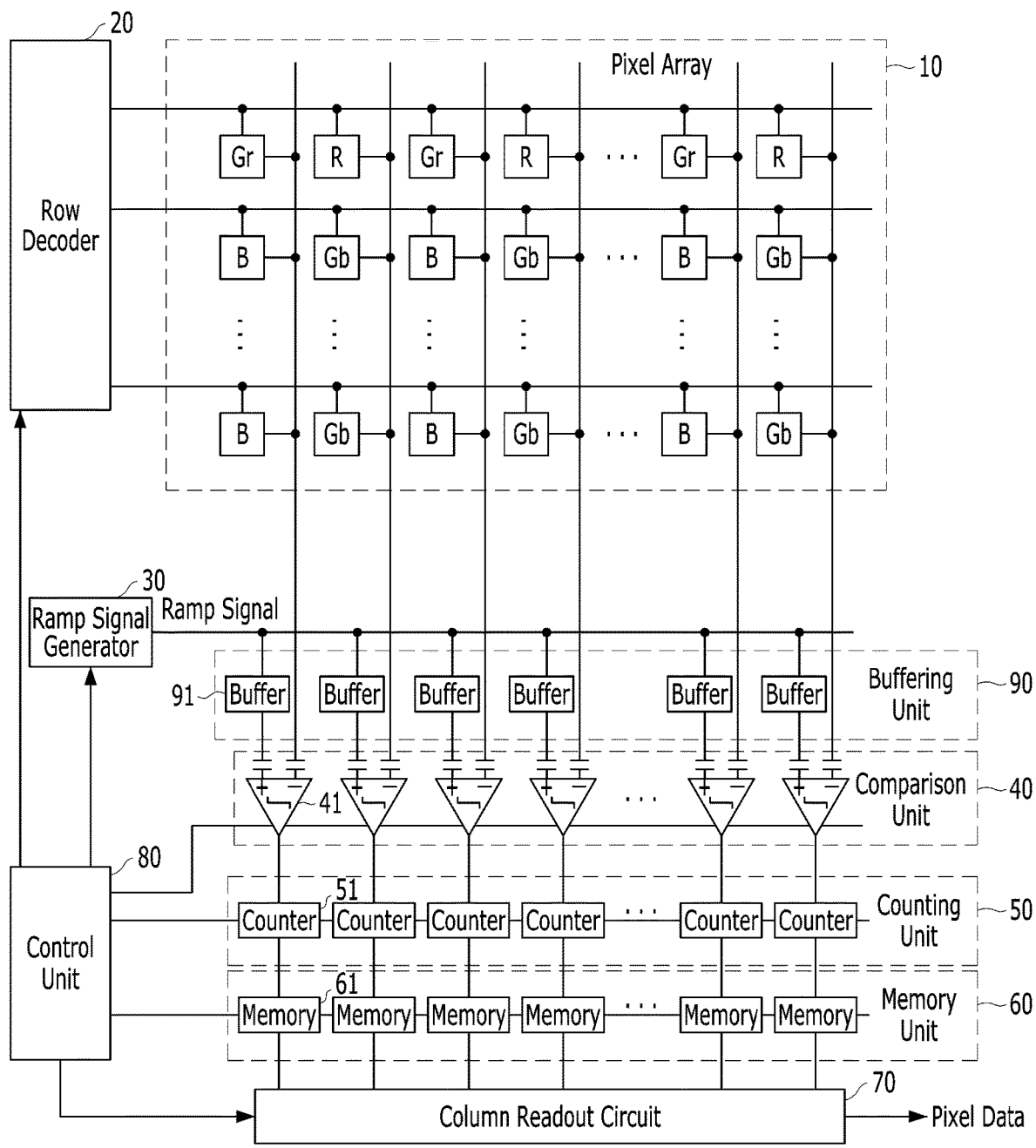
FIG. 3 is a diagram illustrating another example of the CIS for promoting understanding of embodiments.

In order to reduce such banding noise, it has been suggested to include 6 in a CIS. FIG. 3 shows a CIS with buffers provided to reduce banding noise between an output terminal of a ramp signal generator and input terminals of comparators. In FIG. 3, the CIS may further include a buffering unit 90 to buffer the ramp signal applied from the ramp signal generator 30, and the ramp signal is inputted to the respective comparators 41 through the corresponding buffers 91.

When the buffers 91 are added to reduce banding noise, the CIS may require a greater area to accommodate the buffers 91. In addition, due to the use of the buffers 91, more power is needed to operate the CIS, and an input swing may be reduced by gain errors of the buffers.

In recognition of the above issues existing in the conventional CISs, the disclosed technology provides a CIS including a comparator to avoid the changes in the operation regions of the input transistor, thereby reducing the banding noise and improving the resolution of the image. In some implementations, the suggested comparator has the output voltage which is maintained within a range by providing an additional current path flowing in the comparator. In some implementations, the CIS with the suggested comparator can prevent the occurrence of the kick-back error which causes the decrease of the resolution of the image. In some implementations, the suggested comparator can minimize the influence of the output voltage change of the comparator on the parasitic capacitor which is formed in the gate terminal of the NMOS transistor $NM_{12}$.

In some implementations, an output voltage of a comparator is controlled to be at least a preset voltage. By controlling the output voltage range of the comparator, it is possible to reduce an occurrence of banding noise and prevent an influence of banding noise on the operation performance of CDS. The suggested design for a CIS does not include any buffers and thus it is possible to prevent the increase of an area required for the CIS and reduce power consumption as compared to the CIS with buffers. In addition, the reduction in the input swing by the gain errors of the buffers can be prevented. The examples of the suggested configurations will be further described with reference to FIGS. 4A-6.

Figure 4A:
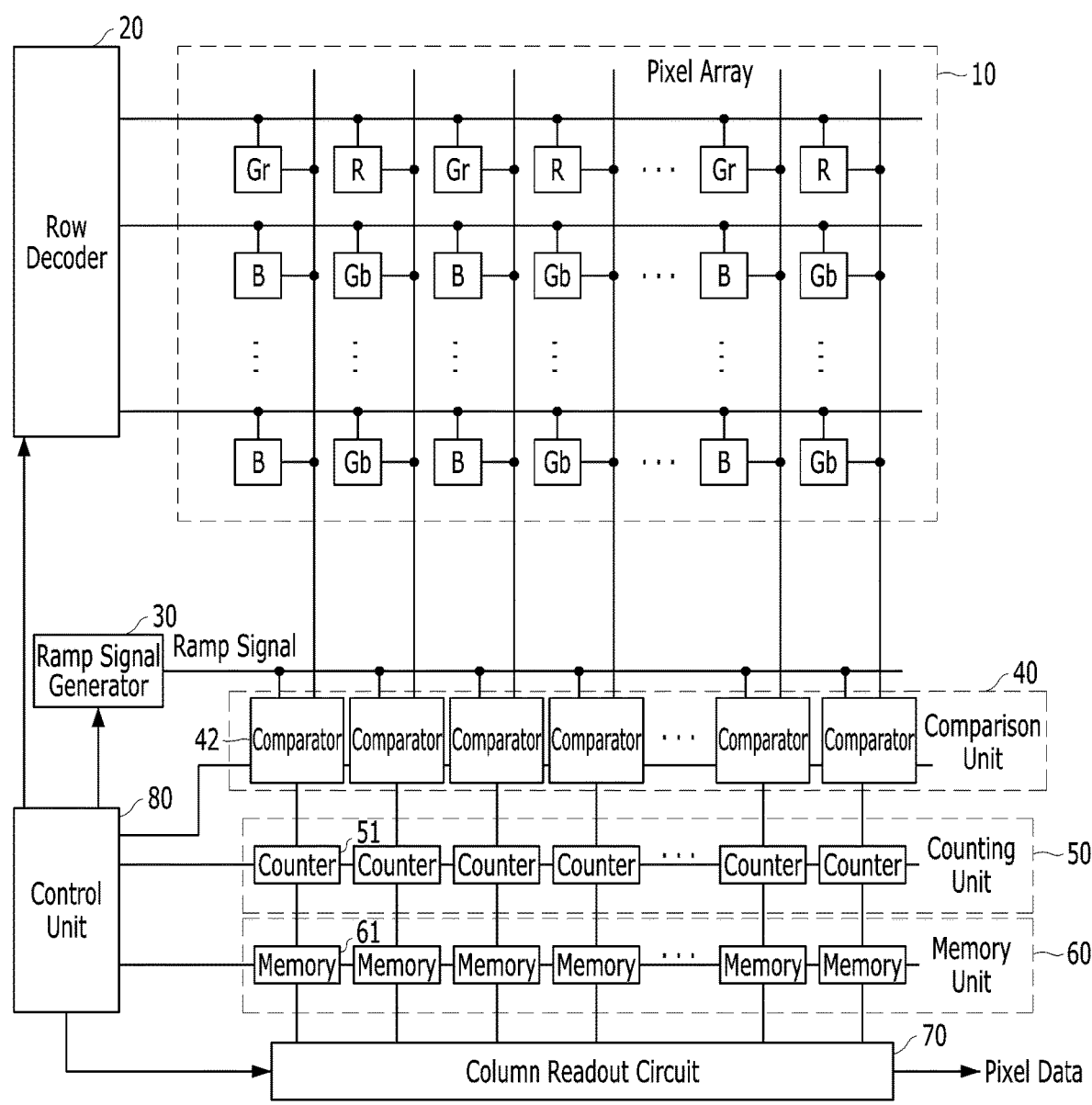
FIG. 4A is a configuration diagram illustrating a CIS based on an embodiment of the disclosed technology.

FIG. 4A is an example of a configuration diagram illustrating a CIS in accordance with an embodiment of the disclosed technology.

As illustrated in FIG. 4A, the CIS in accordance with the present embodiment may include a pixel array 10, a row decoder 20, a ramp signal generator 30, a comparison unit 40, a counting unit 50, a memory unit 60, a control unit 80 and a column readout circuit 70. The pixel array 10 may output pixel signals corresponding to incident light. The row decoder 20 may select a pixel in the pixel array 10 at each row line and control an operation of the selected pixel, under control of the control unit 80. The ramp signal generator 30 may generate a ramp signal under control of the control unit 80. The comparison unit 40 may compare the value of the ramp signal applied from the ramp signal generator 30 to the values of the pixel signals outputted from the pixel array 10 under control of the control unit 80. The counting unit 50 may count a clock applied from the control unit 80 according to each of output signals of the comparison unit 40. The memory unit 60 may store the counting information from the counting unit 50 under control of the control unit 80. The control unit 80 may control the operations of the row decoder 20, the ramp signal generator 30, the comparison unit 40, the counting unit 50, the memory unit 60 and the column readout circuit 70. The column readout circuit 70 may sequentially output the data of the memory unit 60 as pixel data PXDATA under control of the control unit 80. The comparison unit 40 may include a comparator 42 in accordance with an embodiment at each column. The present embodiment may also be applied to a comparator implemented by exchanging the PMOS transistor and the NMOS transistor with each other.

The comparison unit 40 includes a plurality of comparators 42. A comparator 42 may receive, at one terminal of the comparator 42, a pixel signal outputted from a corresponding column of the pixel array 10 and receive, at the other terminal of the comparator 42, the ramp signal applied from the ramp signal generator 30. The comparator 42 may compare the received pixel signal with the received ramp signal based on a control signal from the control unit 80 and output a comparison signal which is obtained as the result of the comparison.

Since the ramp signal $V_{Ramp}$ has a voltage level that increases or decreases to a predetermined magnitude as time elapses after the start of a reset operation, the values of the two signals inputted to each of the comparators may coincide with each other at a certain point of time. After the values of the two signals coincide with each other, the value of the comparison signal outputted from each of the comparators may be inverted.

Figure 4B:
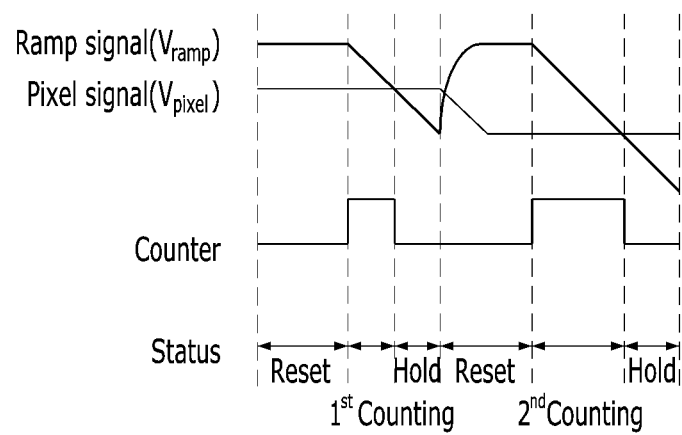
FIG. 4B is an analog-digital conversion timing diagram of the CIS illustrated in FIG. 1.

A counter 51 which is coupled to the comparator 42 may count a clock applied from the control unit 80 from when the ramp signal falls to when the comparison signal outputted from the comparator 41 is inverted and provide the counting information as an output. Each of the counters 51 may be reset according to a reset control signal from the control unit 80. FIG. 4B shows an example of a counting operation performed in a CIS. As shown in FIG. 4B, the CIS may perform primary counting on a reset signal (reset voltage) and perform secondary counting on an image signal (signal voltage).

A memory 61 which is coupled to the counter 51 may receive the counting information from the counter 51 and store the received counting information. The memory 61 may output the counting information to the column readout circuit 70, according to a load control signal from the control unit 80.

In an embodiment, the comparison unit 40 may be implemented as a single-slope ADC including a CDS structure. The pixel array 10 may include photoelectric conversion elements that produce an electrical signal in response to received light including, e.g., a photodiode, a photo transistor, a photo gate, or other photosensitive circuitry capable of converting light into a pixel signal (e.g., a charge, a voltage or a current). The pixel array 10 may convert an optical image information into an electrical image signal and transmit the electrical image signal to the comparison unit 40 with a CDS structure through a corresponding column line. In some implementations, t CDS structure may be implemented to compensate for a mismatch of a source follower and reset noise. The CDS may be performed in an analog region or digital region. In an embodiment, primary CDS may be performed on a pixel signal in the analog region, and then secondary CDS may be performed on a digital signal converted through the ADC in the digital region.

The method for performing CDS in the analog region may be roughly divided into two kinds of methods. One of the methods is to use a separate subtraction circuit for performing CDS, and the other of the methods is to implement CDS with a comparator.

Figure 5:
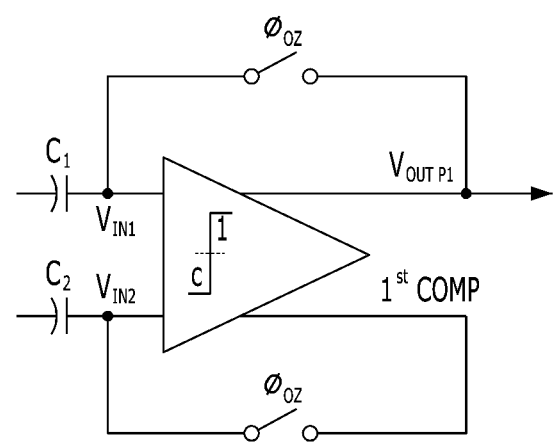
FIG. 5 is an example of a configuration diagram illustrating a comparison unit based on an embodiment of the disclosed technology.

FIG. 5 illustrates an example of a comparator with a CDS structure, which is included in the comparison unit 40. Referring to FIG. 5, the comparator is used to implement CDS and an additional subtraction circuit is not included in the comparison unit 40.

Referring to FIG. 5, a pixel signal $V_{PIX}$ and a ramp signal $V_{RAMP}$ may be applied to one terminals of capacitors $C_1$ and $C_2$, respectively, and the other terminals of the capacitors $C_1$ and $C_2$ may be coupled to a comparator. Input voltages $V_{IN1}$ and $V_{IN2}$ and output voltages $1^{st}$ COMP and $V_{OUTP}$ of the comparator may be coupled through feedback lines including switches φoz and φoz. The switches φoz and φoz may be controlled based on timings at which an image signal and a reset signal of the pixel signal $V_{PIX}$ are sampled. Since each of the ramp voltage $V_{RAMP}$ and the pixel signal $V_{PIX}$ is transferred through one path, performance degradation by a mismatch between signals can be prevented.

Figure 6:
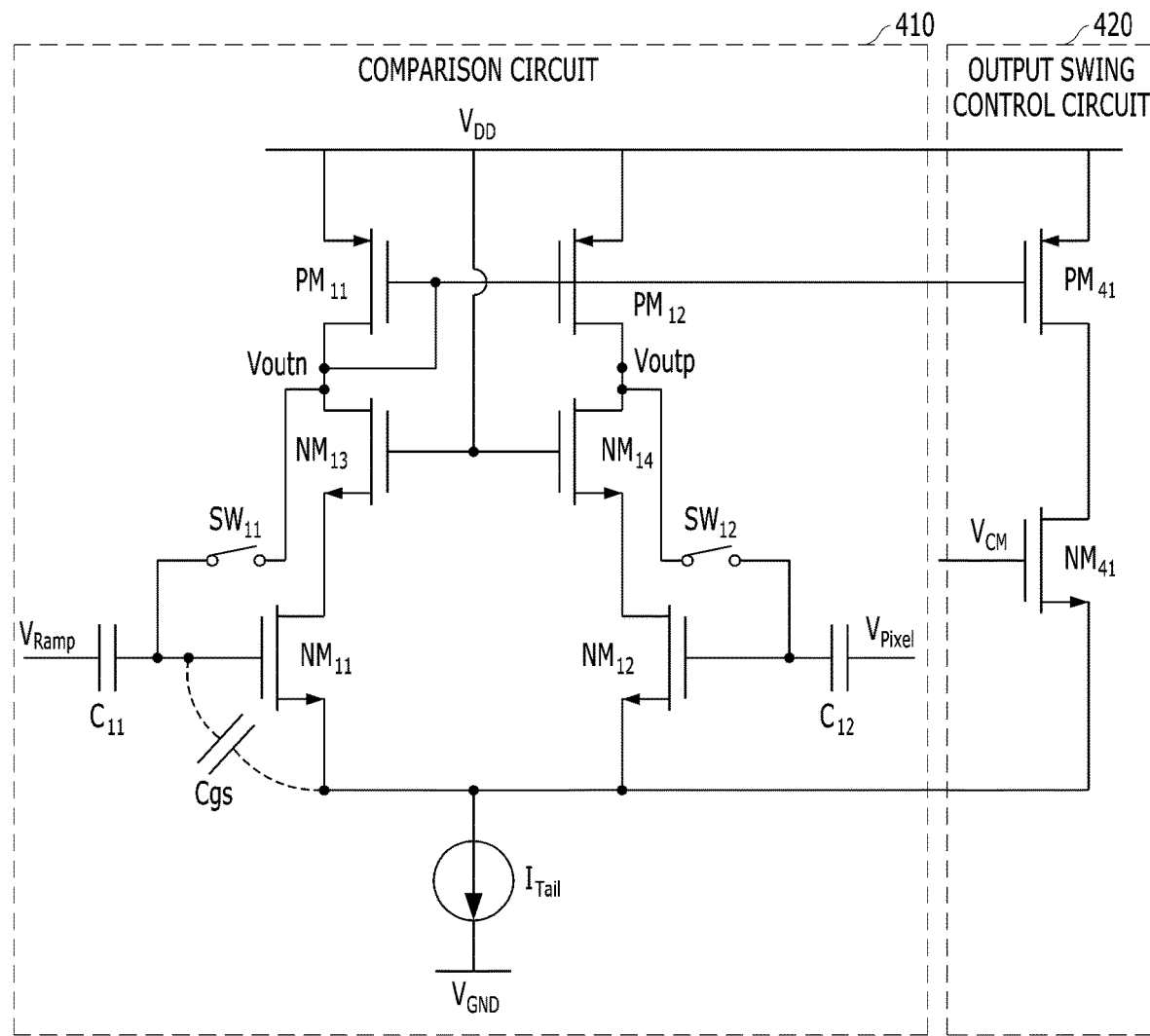
FIG. 6 is an example of a configuration diagram illustrating a comparator based on an embodiment of the disclosed technology.

FIG. 6 shows another example of a comparator used in a comparison unit of a CIS. The comparator shown in FIG. 6 can prevent degradation in performance of the single-slope ADC.

FIG. 6 is an example of a configuration diagram illustrating a comparator in accordance with an embodiment. For example, the comparator as shown in FIG. 6 may correspond to the comparator described with reference to FIGS. 4 and 5.

As illustrated in FIG. 6, the comparator in accordance with the present embodiment may include a comparison circuit 410 and an output swing control circuit 420. The comparison circuit 410 may compare a ramp signal and a pixel signal and output a comparison signal, and the output swing control circuit 420 may control an output voltage of the comparison circuit 410 to be at least a predetermined voltage.

The comparison circuit 410 illustrated in FIG. 6 may include a PMOS transistor $PM_{11}$, a PMOS transistor $PM_{12}$, a capacitor $C_{11}$, a capacitor $C_{12}$, an NMOS transistor $NM_{11}$, an NMOS transistor $NM_{12}$, a switch $SW_{11}$, a switch $SW_{12}$, an NMOS transistor $NM_{13}$, and an NMOS transistor $NM_{14}$. As compared to the structures shown in FIG. 2, the comparison circuit 410 in FIG. 6 may further include the NMOS transistor $NM_{13}$ and the NMOS transistor $NM_{14}$ to minimize an occurrence of kick-back error or kick-back noise. One terminal of each of the switches $SW_{11}$ and $SW_{12}$ is coupled to the drain terminals of the NMOS transistors $NM_{13}$ and $NM_{14}$. The structures and the operations of the elements which are also included in the comparator as shown in FIG. 2 can be understood based on the descriptions with regard to FIG. 2.

Each of the NMOS transistors $NM_{13}$ and $NM_{14}$ may have a self-biasing structure in which the gate terminal thereof is coupled to the first supply voltage $V_{DD}$. The NMOS transistor $NM_{13}$ may have a drain terminal coupled to the drain terminal of the PMOS transistor $PM_{11}$, a gate terminal coupled to the first supply voltage $V_{DD}$, and a source terminal coupled to the drain terminal of the NMOS transistor $NM_{11}$. The NMOS transistor $NM_{14}$ may have a drain terminal coupled to an output node Voutp, a gate terminal coupled to the first supply voltage $V_{DD}$, and a source terminal coupled to the NMOS transistor $NM_{12}$.

In FIG. 6, the NMOS transistors $NM_{13}$ and $NM_{14}$ may be configured to receive the first supply voltage $V_{DD}$ through the gate terminals thereof. In some other implementations, the NMOS transistors $NM_{13}$ and $NM_{14}$ may be configured to receive a third supply voltage $V_B$ from an external voltage supply unit (not illustrated) through the gate terminals thereof.

Even after the gate voltage of the NMOS transistor $NM_{11}$ crosses the gate voltage of the NMOS transistor $NM_{12}$, the ramp signal may fall or rise to a preset full voltage level while falling or rising one step by one step. Thus, the gate voltage of the NMOS transistor $NM_{11}$ may continuously fall or rise. In this case, the output voltage value $V_{outp}$ of the output node may fall or rise by 'voltage difference between NMOS transistors $NM_{11}$ and $NM_{12}$×gain', and the operation region of the NMOS transistor $NM_{12}$ may change to the triode region or the linear region from the saturation region. Thus, the common voltage of the NMOS transistors $NM_{11}$ and $NM_{12}$ may significantly change, and the gate-source parasitic capacitor Cgs of the NMOS transistors $NM_{11}$ and $NM_{12}$ may significantly change.

The output swing circuit 420 may be provided to control the output voltage at the output node Voutp. In some implementations, the output swing control circuit 420 may be implemented as a clamping circuit for clamping a current.

The output swing control circuit 420 may include a PMOS transistor $PM_{41}$ having a source terminal coupled to the first supply voltage $V_{DD}$ and a gate terminal coupled to the comparison circuit 410, i.e. the gate terminals of the load transistors $PM_{11}$ and $PM_{12}$, and an NMOS transistor $NM_{41}$ having a drain terminal coupled to a drain terminal of the PMOS transistor $PM_{41}$, a gate terminal configured to receive the common voltage $V_{CM}$, and a source terminal coupled to the second supply voltage $V_{GND}$ through a current source hail. In some implementations, the common voltage $V_{CM}$ may be supplied from the external voltage supply unit (not illustrated). When the common voltage $V_{CM}$ is clamped to the ground voltage $V_{GND}$, it may be difficult to control a current flowing through the output swing control circuit 420. When the current flowing through the output swing control circuit 420 is adjusted through the common voltage $V_{CM}$, an operation margin of the comparison circuit 410 can be secured.

As discussed above, the change of the operation region (e.g. from the saturation region to a triode region or linear region) of the input transistor $NM_{12}$ receiving the pixel signal $V_{pixel}$ can cause banding noise. Thus, in order to reduce banding noise which occurs during a CDS operation, an operation region (e.g. saturation region) of the NMOS transistor $NM_{12}$ receiving the pixel signal $V_{pixel}$ needs to be maintained without the change into another operation region (e.g. linear region or a triode region). In addition, an operation region of the PMOS transistor $PM_{12}$ serving as a load transistor may affect the occurrence of the banding noise and thus need to be secured to improve the image without banding noise.

The comparator in accordance with some implementations of the disclosed technology may form an additional current path using the PMOS transistor $PM_{41}$ and the NMOS transistor $NM_{41}$ to limit the output voltage Voutp of the comparison circuit 410 to prevent the output from falling too significantly to cause the change of the operation region of the input transistor, e.g., $NM_{12}$. Thus, in some implementations, the minimum value of the output voltage Voutp in the comparison circuit 410 may be preset. Thus, the comparator can have the output swing such that the output voltage of the comparison circuit 410 does not fall below the preset voltage.

Referring to FIG. 6, the output swing control circuit 420 operates to control the output voltage Voutp to, for example, prevent the output voltage to drop not to fall as significantly as compared to the comparator without having the output swing control circuit 420. For example, assume that the voltages at the gate terminals of the NMOS transistors $NM_{11}$ and $NM_{12}$ change sufficiently to cause the operation region of the NMOS transistors $NM_{12}$ and $NM_{14}$ to change from the saturation region to triode region or the linear region. The voltage changes at the gate terminals of the NMOS transistors $NM_{11}$ and $NM_{12}$ result in the voltage changes at source terminals of the NMOS transistors $NM_{11}$ and $NM_{12}$. Since the source terminal of the NMOS transistor $NM_{41}$ is coupled to the source terminals of the NMOS transistors $NM_{11}$ and $NM_{12}$, such voltage changes at the source terminals of the NMOS transistors $NM_{11}$ and $NM_{12}$ can affect the NMOS transistor $NM_{41}$ of the output swing control circuit 420. For example, as the gate-source voltage Vgs, which is obtained as "$V_{CM}$-Voltage at source terminals of the NMOS transistors $NM_{11}$ and $NM_{12}$," becomes greater, the current flowing through the NMOS transistor $NM_{41}$ increases. In this manner, the current corresponding to the voltage differences at the gate terminals of the NMOS transistors $NM_{11}$ and $NM_{12}$ can flow through the transistors $NW_{41}$ and $PM_{41}$ in the output swing control circuit 420.

Thus, the current path formed by the PMOS transistor $PM_{41}$ and the NMOS transistor $NM_{41}$ of the output swing control circuit 420 allows the output voltage of the comparison circuit 410 to be controlled such that the output voltage of the comparison circuit 410 maintains at a value (or within a range of values) which does not cause the change of the operation region of the input transistor $NM_{12}$ which receives the pixel signal. The output swing control circuit 420 for securing an operation margin of the comparison circuit 410 may include two transistors, i.e. the PMOS transistor $PM_{41}$ and the NMOS transistor $NM_{41}$, while the comparison circuit 410 may include six transistors. Such a difference in the number of transistors or a difference in size therebetween may have no influence on the performance of the output swing control circuit 420. Since the drain terminals of the PMOS transistor $PM_{41}$ and the NMOS transistor $NM_{41}$ have high impedance, the amount of current flowing through the output swing control circuit 420 may not be substantially great. The amount of current may be changed depending on how much the current of the current source $I_{Tail}$ is used by each of the transistors included in the current path of the comparison circuit 410 and the current path of the output swing control circuit 420. The sizes of the PMOS transistor $PM_{41}$ and the NMOS transistor $NW_{41}$ which are included in the output swing control circuit 420 can be decided according to the design condition and use environment of the comparison circuit 410, thereby further improving the performance by the output swing control circuit 420.

Through the above-described configuration, the operation regions of the NMOS transistor $NM_{12}$ and the PMOS transistor $PM_{12}$ can be maintained without changes among different operation regions. Thus, it is possible to reduce banding noise which may be caused by the change in the operation regions of the comparator (e.g., from the saturation region to the triode region or the linear region). Furthermore, the influence of the change in output voltage value Voutp of the output node on a parasitic capacitor formed at the gate terminal of the NMOS transistor $NM_{12}$ can be minimized to reduce occurrence of kick-back error (kick-back noise). In addition, since the suggested structure does not require a buffer between the ramp signal generator and the comparator, it is possible to save an area and/or power, as compared to the case applying a ramp signal through a buffer.

In an embodiment, the comparison circuit 410 can include a first mirror circuit and a second mirror circuit. The first mirror circuit including the PMOS transistor $PM_{11}$ and the PMOS transistor $PM_{12}$ is coupled between a supply voltage $V_{DD}$ and the second mirror circuit. The second mirror circuit is configured to receive a ramp signal and a pixel signal, compare the ramp signal and the pixel signal, and output a comparison signal at an output node. The second mirror circuit can include the NMOS transistor $NM_{13}$ and the NMOS transistor $NM_{14}$. The comparison circuit 410 is coupled to a sink circuit including the NMOS transistor $NM_{41}$. The sink circuit can be coupled to the second mirror circuit for adjusting an amount of current based on a common voltage in order to secure an operation margin of the second mirror circuit.

In accordance with the various embodiments of the disclosed technology, the comparator has an output voltage whose range has a preset minimum value not to cause the change of the operation region of the input transistor receiving the pixel signal. Thus, it possible to reduce occurrence of banding noise and prevent an influence of banding noise on the operation performance of CDS.

Furthermore, since no buffers are used, as compared to the CIS with buffers, it is possible to reduce the area required for the CIS and power consumption. In addition, the input swing is not reduced by a gain error of a buffer since the suggested CIS does not requires a buffer.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A comparator comprising:
   a comparison circuit including a first transistor configured to receive a ramp signal and a second transistor configured to receive a pixel signal, the comparison circuit configured to compare the ramp signal and the pixel signal and output a comparison signal at an output node; and
   an output swing control circuit coupled to the first transistor and the second transistor, and the output swing control circuit including a current path to decrease an amount of current flowing through the second transistor,
   wherein the output swing control circuit is configured to enable the second transistor to operate in a saturation region for a larger range of change in the pixel signal as compared to a comparator without the output swing control circuit.

2. The comparator of claim 1, wherein a current flowing in the current path has a value corresponding to a voltage difference between terminals of the first transistor and the second transistor.

3. The comparator of claim 1, wherein terminals of the first transistor and the second transistor are coupled to a current source.

4. The comparator of claim 1, wherein the output swing control circuit is configured to maintain a voltage at the output node to be equal to or greater than a predetermined value.

5. The comparator of claim 1, wherein the pixel signal is received from a pixel array including photoelectric conversion elements, each producing an electrical signal in response to light incident on the pixel array.

6. The comparator of claim 1, wherein the output swing control circuit includes a third transistor coupled to the first transistor and the second transistor and a fourth transistor electrically coupled in serial configuration with the third transistor.

7. The comparator of claim 1, further comprising:
   a fifth transistor having a source terminal coupled to a drain terminal of the first transistor or the second transistor and a gate terminal coupled to a voltage source; and
   a sixth transistor having a source terminal coupled to a drain terminal of the fifth transistor and a source terminal to the voltage source.

8. An image sensing device comprising:
   a pixel array including photoelectric conversion elements, each photoelectric conversion element configured to produce a pixel signal in response to light incident on the pixel array;
   a ramp signal generator to generate a ramp signal;
   a comparison circuit coupled to the pixel array and the ramp signal generator to receive the pixel signal and the ramp signal, the comparison circuit configured to compare the ramp signal and the pixel signal; and
   an output swing control circuit coupled to the comparison circuit and configured to maintain an output voltage of the comparison circuit to be equal to or greater than a preset voltage,
   wherein the output swing control circuit includes:
   a first transistor having a source terminal coupled to a current source; and
   a second transistor having a drain terminal coupled to a drain terminal of the first transistor and a source terminal coupled to a voltage source.

9. The image sensing device of claim 8, wherein the first transistor and the second transistor are an NMOS transistor and a PMOS transistor, respectively.

10. The image sensing device of claim 8, wherein the comparison circuit includes:
    a third transistor having a source terminal coupled to the current source and a gate terminal coupled to the ramp signal generator; and
    a fourth transistor having a source terminal coupled to the current source and a gate terminal coupled to the pixel array.

11. The image sensing device of claim 10, wherein the fourth transistor is configured to operate in a saturation region.

12. The image sensing device of claim 10, wherein the comparison circuit further includes:
    a fifth transistor having a source terminal coupled to the voltage source and a drain terminal coupled to the third transistor; and
    a sixth transistor having a source terminal coupled to the voltage source, a drain terminal coupled to the fourth transistor, and a gate terminal coupled to a gate terminal of the fifth transistor.

13. The image sensing device of claim 12, wherein a gate terminal of the second transistor is coupled to the gate terminals of the fifth transistor and the sixth transistor.

14. The image sensing device of claim 8, further comprising a counting circuit coupled to the comparison circuit and configured to count a clock based on an output signal from the comparison circuit.

15. The image sensing device of claim 14, further comprising a memory coupled to the counting circuit and configured to store counting information from the counting circuit.

16. The image sensing device of claim 8, wherein an amount of current flowing in the output swing control circuit corresponds to a difference between the ramp signal and the pixel signal.

17. The image sensing device of claim 8, wherein the output swing control circuit functions as a clamping circuit to limit an output voltage of the comparison circuit.

18. A comparator comprising:
a first mirror circuit coupled between a supply voltage and a second mirror circuit;
the second mirror circuit configured to receive a ramp signal and a pixel signal, compare the ramp signal and the pixel signal, and output a comparison signal at an output node; and
a sink circuit coupled to the second mirror circuit for adjusting an amount of current based on a common voltage to secure an operation margin of the second mirror circuit,
wherein the sink circuit includes:
a first transistor having a source terminal coupled to a current source; and
a second transistor having a drain terminal coupled to a drain terminal of the first transistor and a source terminal coupled to a voltage source.

* * * * *